(12) United States Patent
Redburn et al.

(10) Patent No.: US 10,101,388 B2
(45) Date of Patent: Oct. 16, 2018

(54) METHOD FOR ENHANCED SEMICONDUCTOR PRODUCT DIAGNOSTIC FAIL SIGNATURE DETECTION

(71) Applicant: International Business Machines Corporation, Armonk, NY (US)

(72) Inventors: Robert C. Redburn, Fishkill, NY (US); Andrew A. Turner, Underhill, VT (US); Jeffrey S. Zimmerman, Swanton, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 41 days.

(21) Appl. No.: 14/969,119

(22) Filed: Dec. 15, 2015

(65) Prior Publication Data

US 2017/0168112 A1    Jun. 15, 2017

(51) Int. Cl.
*G01R 31/3177* (2006.01)

(52) U.S. Cl.
CPC ............... *G01R 31/3177* (2013.01)

(58) Field of Classification Search
CPC ........ G01R 31/3177; G01R 31/318566; G01R 31/3193; G01R 31/318547; G06F 17/50
See application file for complete search history.

(56) References Cited

U.S. PATENT DOCUMENTS

| | | | |
|---|---|---|---|
| 5,539,753 A * | 7/1996 | Connor ............... | G06F 11/2733 714/30 |
| 6,880,136 B2 | 4/2005 | Huisman | |
| 6,901,546 B2 * | 5/2005 | Chu ................ | G01R 31/31705 714/726 |
| 6,920,525 B2 * | 7/2005 | Chadwick .............. | G11C 15/00 365/200 |
| 7,596,736 B2 | 9/2009 | Kassab | |
| 7,853,848 B2 | 12/2010 | Desineni | |
| 8,006,152 B2 * | 8/2011 | Ward ............ | G01R 31/318566 714/726 |
| 8,302,050 B1 | 10/2012 | Hollander | |

(Continued)

FOREIGN PATENT DOCUMENTS

| | | |
|---|---|---|
| EP | 0780767 A2 | 6/1997 |
| WO | WO0142803 A2 | 6/2001 |
| WO | WO2007069098 A1 | 6/2007 |

OTHER PUBLICATIONS

Desineni, Rao, et al. "Hard to find, easy to find systematics; just find them", In Test Conference (ITC), 2010 IEEE International, pp. 1-10. IEEE, 2010.

(Continued)

*Primary Examiner* — Kyle Vallecillo
(74) *Attorney, Agent, or Firm* — Cantor Colburn LLP; Steven Meyers (57) ABSTRACT

Disclosed herein is a method for failure signature detection in a semiconductor comprising generating defect signatures for failing latches from a plurality of integrated circuit chips; generating a latch to mask relationship for the failing latches; generating maximally descriptive masks into identities; generating a list of identities for comparison; determining commonalities between the lists of identities; and generating details about differences and commonalities within the defect signatures.

19 Claims, 5 Drawing Sheets

(56) References Cited

U.S. PATENT DOCUMENTS

| | | |
|---|---|---|
| 8,451,018 B2 | 5/2013 | Furland |
| 8,667,431 B1 * | 3/2014 | Douskey ........ G01R 31/318566 716/136 |
| 9,404,969 B1 * | 8/2016 | Keller .............. G01R 31/31703 |
| 9,448,282 B1 * | 9/2016 | Meehl ............ G01R 31/318335 |
| 2006/0041812 A1 * | 2/2006 | Rajski ............ G01R 31/318547 714/742 |
| 2006/0041813 A1 * | 2/2006 | Rajski ............ G01R 31/318547 714/742 |
| 2006/0041814 A1 * | 2/2006 | Rajski ............ G01R 31/318547 714/742 |
| 2006/0156128 A1 * | 7/2006 | Grinchuk ....... G01R 31/318547 714/732 |
| 2006/0200719 A1 * | 9/2006 | Keller ............ G01R 31/318547 714/732 |
| 2009/0106614 A1 | 4/2009 | Desineni |
| 2011/0199114 A1 | 8/2011 | Furland |
| 2013/0166977 A1 * | 6/2013 | Pugliesi-Conti ... G01R 31/3177 714/727 |
| 2014/0115413 A1 | 4/2014 | Guo |
| 2014/0149814 A1 | 5/2014 | Al-Omari |

OTHER PUBLICATIONS

Huisman, Leendert M., et al.; "Data mining integrated circuit fails with fail commonalities", In Test Conference, 2004. Proceedings. ITC 2004. International, pp. 661-668. IEEE, 2004.

* cited by examiner

| Avg is 14.29 on 10 items | | | | | | | |
|---|---|---|---|---|---|---|---|
| # | hash | chain | latch | name | | dieCnt | ids | pct |
| 1 | -211358573 | e_c4_bc_p_a1_ck0_dat_p(12) | 44481 | ex13|l3.l3_df.l3eccrdw6.xmuxed_dataq_esc | 39|l0.eslatcore | 1 | 81 | 14.29 |
| 2 | -211358573 | e_c4_bc_p_a0_ck0_dat_p(8) | 44507 | ex10|l3.l3_df.l3eccrdw6.xmuxed_dataq_esc | 7|l0.eslatcore | 1 | 77 | 14.29 |
| 3 | -211358573 | e_c4_bc_p_a0_ck0_dat_p(10) | 44573 | ex11|l3.l3_df.l3eccrdw6.xmuxed_dataq_esc | 34|l0.eslatcore | 1 | 37 | 14.29 |
| 4 | -211358573 | e_c4_bc_p_a0_ck0_dat_p(4) | 143101 | ex09|l3.l3_df.l3eccrdw2.xmuxed_dataq_esc | 59|l0.eslatcore | 1 | 79 | 14.29 |
| 5 | -211358573 | e_c4_bc_p_a0_ck0_dat_p(4) | 143103 | ex09|l3.l3_df.l3eccrdw2.xmuxed_dataq_esc | 57|l0.eslatcore | 1 | 79 | 14.29 |
| 6 | -211358573 | e_c4_bc_p_a0_ck0_dat_p(5) | 198934 | ex09|l3.l3_df.l3eccrdw4.xmuxed_dataq_esc | 39|l0.eslatcore | 1 | 80 | 14.29 |
| 7 | -211358573 | e_c4_bc_p_a1_ck0_dat_p(15) | 235259 | ex14|l3.l3_df.l3eccrdw7.xmuxed_dataq_esc | 58|l0.eslatcore | 1 | 58 | 14.29 |
| 8 | -211358573 | e_c4_bc_p_a1_ck0_dat_p(15) | 235269 | ex14|l3.l3_df.l3eccrdw7.xmuxed_dataq_esc | 57|l0.eslatcore | 1 | 58 | 14.29 |
| 9 | -211358573 | e_c4_bc_p_a1_ck0_dat_p(11) | 235296 | ex06|l3.l3_df.l3eccrdw7.xmuxed_dataq_esc | 54|l0.eslatcore | 1 | 78 | 14.29 |
| 10 | -211358573 | e_c4_bc_p_a1_ck0_dat_p(11) | 235303 | ex06|l3.l3_df.l3eccrdw7.xmuxed_dataq_esc | 51|l0.eslatcore | 1 | 78 | 14.29 | core     macro     column
           copy

Figure 4

METHOD FOR ENHANCED SEMICONDUCTOR PRODUCT DIAGNOSTIC FAIL SIGNATURE DETECTION

BACKGROUND

This disclosure relates to a method for enhanced semiconductor product diagnostic fail signature detection and to a system for accomplishing this.

Integrated circuits (ICs) are deemed bad when they contain certain defects that cause the ICs to fail the specifications. Defects are unintended structural and/or material changes in the IC due to design/manufacturing imperfections. These physical changes may alter the electrical characteristics of the circuit, which are sometimes severe enough to lead to a failure (i.e., a violation of one or more design specifications). Common defects in IC manufacturing can be caused by contaminations in the process, variations of the process conditions, or simply the difficulty to fabricate certain features of the design. As would be expected, these defects are undesirable.

SUMMARY

Disclosed herein is a method for failure signature detection in a semiconductor comprising generating defect signatures for failing latches from a plurality of integrated circuit chips; generating a latch to mask relationship for the failing latches; generating maximally descriptive masks into identities; generating a list of identities for comparison; determining commonalities between the lists of identities; and generating details about differences and commonalities within the defect signatures.

Disclosed herein too is a computer program product comprising a non-transitory storage medium readable by a processing circuit and storing instructions for execution by the processing circuit for performing a method comprising generating defect signatures for failing latches from a plurality of integrated circuit chips; generating a latch to mask relationship for the failing latches; generating maximally descriptive masks into identities; generating a list of identities for comparison; determining commonalities between lists of identities; and generating details about differences and commonalities within a signature.

Disclosed herein too is a test system for failure signature detection in a semiconductor comprising a processing unit; where the processing unit is operative to perform deterministic tests on the integrated circuit chips to generate defect signatures for failing latches from a plurality of integrated circuit chips; a memory that is communication with the processing unit; where the memory comprises an analyzing system that is operative analyze a plurality of defect signatures derived from the failing latches; a modifying system that is operative to generate defect signatures for failing latches from a plurality of integrated circuit chips; generate a latch to mask relationship for the failing latches; generate maximally descriptive masks into identities; generate a list of identities for comparison; determine commonalities between lists of identities; and generate details about differences and commonalities within a signature.

DETAILED DESCRIPTION

Disclosed herein is a method of determining relationships between defective integrated circuits (ICs) chips which produce data that is uncompressed, such as test results which generate data on the scan chains. Briefly put, the method for creating failure signatures in a semiconductor comprises generating a mask based upon the population of representative latch names. A latch to mask relationship is generated for the failing latches and this relationship is used for generating data that is most easily compared to observations across a plurality of integrated circuit chips to produce defect signatures from the data. The defect signatures are studied in order to determine commonality amongst the defects and a connection between the signature and the originating source data it represents may then be established. The defect signature (hereinafter sometimes referred to as a signature) can be examined to note that no data was lost in the process and an analyst would therefore know which chips are represented by the signature, the tests that contributed data to the signature, and so on.

Part of the normal manufacturing process of integrated circuits (ICs) is verifying that the ICs are free of defects. In order to accomplish this ICs are subjected to a tests that can determine the presence of defects. The immediate goal of this testing step is the identification of all defective ICs. A secondary goal is collecting fail data for each defective IC. This fail data can then be used later, if so desired, to identify the defect that caused the fail. The combined fail data for a set of defective ICs can also be used to obtain information about the defects, however, if it was collected in sufficient volume, and with sufficient detail. For example, the effectiveness of the various steps in the test sequence in detecting defects can be obtained, and fail probabilities can be determined for various embedded objects, like embedded random access memory (RAM).

Another use of fail data is to diagnose the failing ICs using more or less standard diagnostic techniques. Since the number of failing chips is large, the diagnosis has to be fast. Rapid volume diagnosis has been used to identify repetitive failure mechanisms. However, traditional volume diagnostics using tools are extremely cost ineffective. A number of hurdles such as, for example, securing the appropriate licenses, employing large servers for the diagnosis and the accompanying surrounding infrastructure must exist to even begin to utilize larger volume analysis. If the generation of such large volume data were easily accomplished then it could be made even more effective by combining it with the results of inline inspection.

Existing methods of finding common failure mechanisms are either poor at creating realistic populations or use huge sample sets, use large infrastructure investments and do not provide context for observed data. Finding repeating fail signals in logic and chain diagnostic data is either quick and of little use or painfully slow, requires significant software and hardware infrastructure, and excessively detailed while losing context to the data collected. It is therefore desirable to find a method for detecting defects and allows for broad classification of repeating defects in multiple data types while providing data to make further judgments about other matters (e.g., manufacturing problems or material defects) that can eventually lead to a reduction in such defects.

The method includes subjecting the scan chain latches to a test pattern and after the test pattern is complete, the data in the latches is scanned out and compared to the expected data. Only the data from the test that does not equal the expected data is the source data used herein. Examples of this test pattern are ATPG (At Tester Pattern Generation), scan chain diagnostic tests (such as those derived from XOR inversions), and full-unload versions of compressed tests (LBIST, OPMISR, and the like.).

The method includes translating the fail data from its tester value (pin or chain name and chain bit position), to a design name, such as its fully qualified VHDL name which is unique in the chip, and using these textual names to discover alternative fuzzy representations of the names. These fuzzy names, or "masks", can then be converted to unique integer identities, which can be used as if they were the original source chain position data. It is convenient to make these identities negative to disambiguate these identities from simple chain positions. This conversion enables a singular value to represent a plurality of source fail data. The fail data for a chip is grouped as so desired by an analyst, generally by chip, test mode (scan chain configuration), condition, and chain, resulting in an array of integer chain positions where some or all of these integer values are actually values representing masks. These arrays are easily related to one another, across the plurality of observations from other chips, test conditions, and so on. The similarities between these arrays represent a fingerprint of how a common defect may be representing itself on the observable scan chain. In other words, the data observed for any given fail is a finger print or shadow of the fail projected onto the scan chain.

The conversion from raw data through signature reduces the noise and highlights the common behavior across the sum of the data, allowing for a chip wide interpretation of how a common defect is manifesting itself across the plurality of duplicate structures on the chip. An analyst can note and determine consistencies and differences across the signatures. An analysis such as, for example, a statistical analysis may then be performed on the masked signatures to determine correlations (commonalities) in defects across the various scan chains. The correlations provide the analyst with a list of commonly occurring defects in the scan chains that may result from defective manufacturing processes, defective raw materials, or the like.

The commonalities in defects may be classified into basic commonalities, standard commonalities and enhanced commonalities. Basic commonalities include multiple chip failures on the same chain and latch. Standard commonalities include multiple chips failing the same latch position across identical chains (e.g., the core chains if the design provides it). The enhanced commonality does not have the limitation of only being able to relate identical failing positions across duplicated chains in the chip (e.g., chains that are identical except that they are on different copies of cores) but also allows relationships to be built on separate fails within the same chain, seemingly unrelated logic hierarchies or across cores, and the like.

This method is advantageous in that it can be simultaneously performed on large numbers of ICs and is particularly applied to logic and scan-chain diagnostic data. Another benefit of this method is that it does not require patterns to be generated through the test solution vendor to be used. Data from custom and hand edited patterns may be used to generate useful information. This method allows for broad classification of repeating fail signatures in multiple data types while providing data to make further judgments.

Using fail signatures is desirable because the signatures can be used to compare different chips, or the same chip under different test conditions, and these comparisons may then indicate if the fails were caused by the same defect mechanism. This type of comparison will be called commonality analysis. Once a way is found to reliably compare different ICs, the failing ones can be clustered into groups of ICs that seem to have failed because of the same or similar defects. One reason for attempting such clustering is that, if all the ICs in a single group did fail because of similar defects, information like occurrence probabilities of such defects is available immediately. In addition, diagnosis can then be targeted to the more frequent defects in the ICs.

The method and the system disclosed herein may be used to analyze defects in ultra-large-scale integration (ULSI), wafer scale integration (WSI), system on a chip (SOC) and 3-dimensional (3D IC) integrated circuit chips. A three-dimensional integrated circuit (3D IC) is an integrated circuit manufactured by stacking silicon wafers and/or dies and interconnecting them vertically using through-silicon vias (TSVs) so that they behave as a single device to achieve performance improvements at reduced power and smaller footprint than conventional two dimensional processes.

Figure 1:
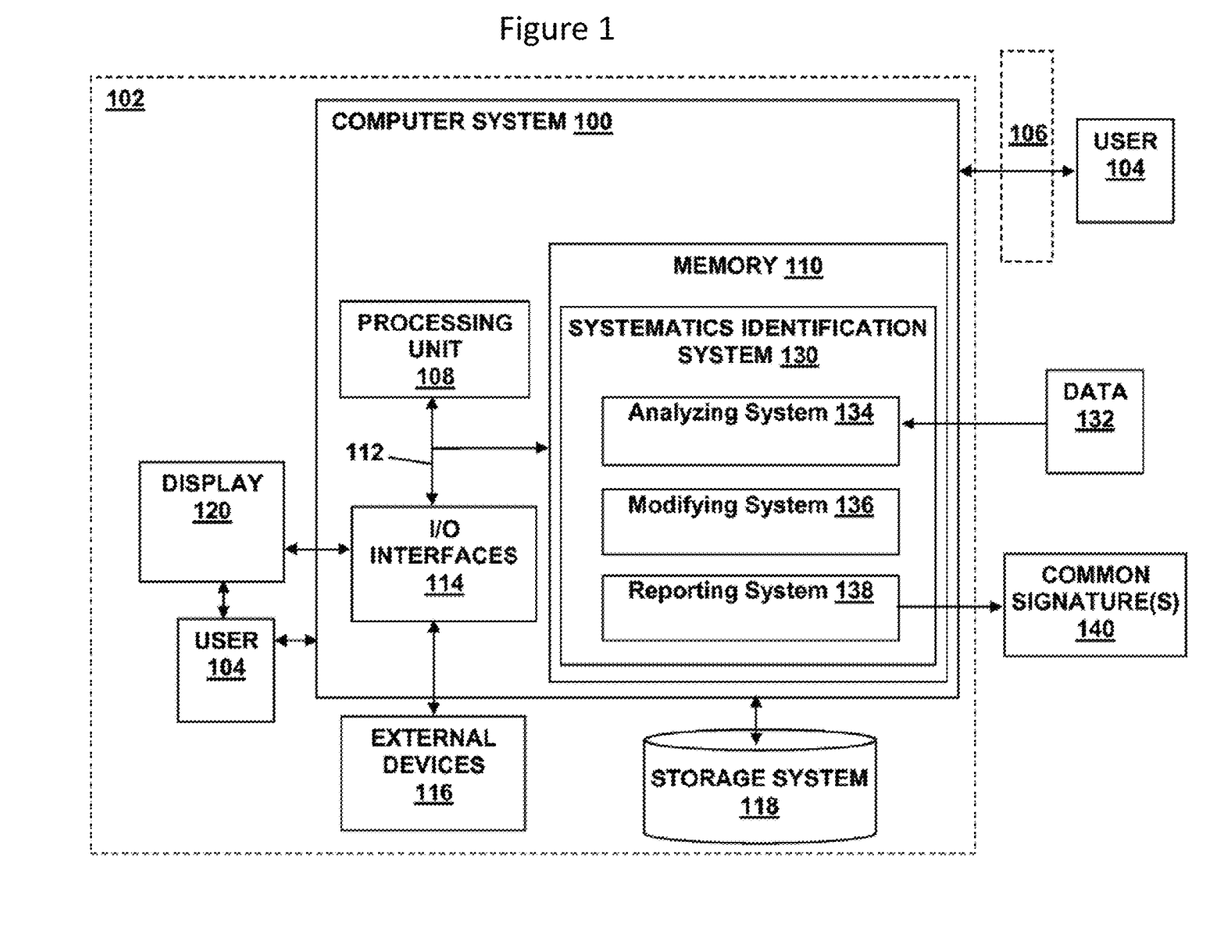
FIG. 1 is a depiction of an exemplary test system for testing integrated circuits.

The FIG. 1 is a depiction of an exemplary test system 100 for testing integrated circuits. Test system 100 is provided in a computer infrastructure 102. Test system 100 is intended to represent any type of computer system that can be used to test integrated circuits and to analyze the data obtained therefrom. For example, test system 100 can be a laptop computer, a desktop computer, a workstation, a handheld device, a server, a cluster of computers, and the like. In addition, as will be further described below, test system 100 can be deployed and/or operated by a service provider that provides a service for testing ICs and for identifying systematics in data. It should be appreciated that a user 104 (e.g., a human or another computer) can access test system 100 directly, or can operate a computer system that communicates with test system 100 over a network 106 (e.g., the Internet, a wide area network (WAN), a local area network (LAN), a virtual private network (VPN), and the like). In the case of the latter, communications between test system 100 and a user-operated computer system can occur via any combination of various types of communications links. For example, the communication links can comprise addressable connections that can utilize any combination of wired and/or wireless transmission methods. Where communications occur via the Internet, connectivity can be provided by conventional TCP/IP sockets-based protocol, and an Internet service provider can be used to establish connectivity to the Internet.

Test system 100 is shown including a processing unit 108, a memory 110, a bus 112, and input/output (I/O) interfaces 114. Further, test system 100 is shown in communication with external devices/resources 116 and one or more storage systems 118. In general, processing unit 108 executes computer program code, such as systematics identification system 130 stored in memory 110 and/or storage system(s) 118. While executing computer program code, processing unit 108 can read and/or write data, to/from memory 110, storage system(s) 118, and/or I/O interfaces 114. The processing unit 108 is operative to perform deterministic tests on the integrated circuit chips to determine latch defects. In an embodiment, the processing unit 108 is operative to perform deterministic tests on the integrated circuit chips (not shown) to generate defect signatures for failing latches from the plurality of integrated circuit chips.

Bus 112 provides a communication link between each of the components in test system 100. External devices/resources 116 can comprise any devices (e.g., keyboard, pointing device, display (e.g., display 120, printer, and the like.)) that enable a user to interact with test system 100 and/or any devices (e.g., network card, modem, and the like.) that enable test system 100 to communicate with one or more other computing devices. External devices/resources 116 can also comprise a system for generating/providing the set(s) of data 132 to be analyzed by the systematics identification system 130.

Computer infrastructure 102 is only illustrative of various types of computer infrastructures that can be used to implement the methods disclosed herein. For example, in one embodiment, computer infrastructure 102 can comprise two or more computing devices (e.g., a server cluster) that communicate over a network (e.g., network 106) to perform the various process steps. Moreover, test system 100 is only representative of the many types of computer systems that can be used in the practice of the present invention, each of which can include numerous combinations of hardware/software. For example, processing unit 108 can comprise a single processing unit, or can be distributed across one or more processing units in one or more locations, e.g., on a client and server. Similarly, memory 110 and/or storage system(s) 118 can comprise any combination of various types of data storage and/or transmission media that reside at one or more physical locations. Further, I/O interfaces 114 can comprise any system for exchanging information with one or more external devices/resources 116. Still further, it is understood that one or more additional components (e.g., system software, communication systems, cache memory, and the like.) not shown in the FIG. 1 can be included in test system 100. However, if test system 100 comprises a handheld device or the like, it is understood that one or more external devices/resources 116 (e.g., a display) and/or one or more storage system(s) 118 can be contained within test system 100, and not externally as shown.

Storage system(s) 118 can be any type of system (e.g., a database) capable of providing storage for information obtained from the testing. To this extent, storage system(s) 118 can include one or more storage devices, such as a magnetic disk drive or an optical disk drive. In another embodiment, storage system(s) 118 can include data distributed across, for example, a local area network (LAN), wide area network (WAN) or a storage area network (SAN) (not shown). Moreover, although not shown, computer systems operated by user 104 can contain computerized components similar to those described above with regard to test system 100.

Shown in memory 110 (e.g., as a computer program product) is a systematics identification system 130 for identifying systematics in set(s) of data 132 as will be detailed below. In general, the systematics identification system 130 comprises an analyzing system 134 for analyzing a set of data 132 (or a revised set of data 132) to identify common signature(s) 140, a modifying system 136 for modifying the set of data 132 to form a revised set of data 132 (or for modifying a revised set of data 132 to provide a further modified set of data 132, and the like.), and a reporting system 138 for reporting the identified common signature(s) 140. The systematics identification system 130 is configured to carry out an iterative process, such as that depicted in one or more of the FIGS. 2(A), 2(B) and 3 that will be detailed below.

In an embodiment, the memory 110 comprises an analyzing system 134 that is operative to analyze a plurality of defect signatures derived from the failing latches. The memory further comprises a modifying system 136 that is operative to generate a mask for the plurality of defect signatures; generate a latch to mask relationship for the failing latches; and determine commonalities between the masked signatures. Details about the mask generation, generation of the latch to mask relationship and the determination of the commonalities between the masked signatures will be detailed later.

Figure 2A:
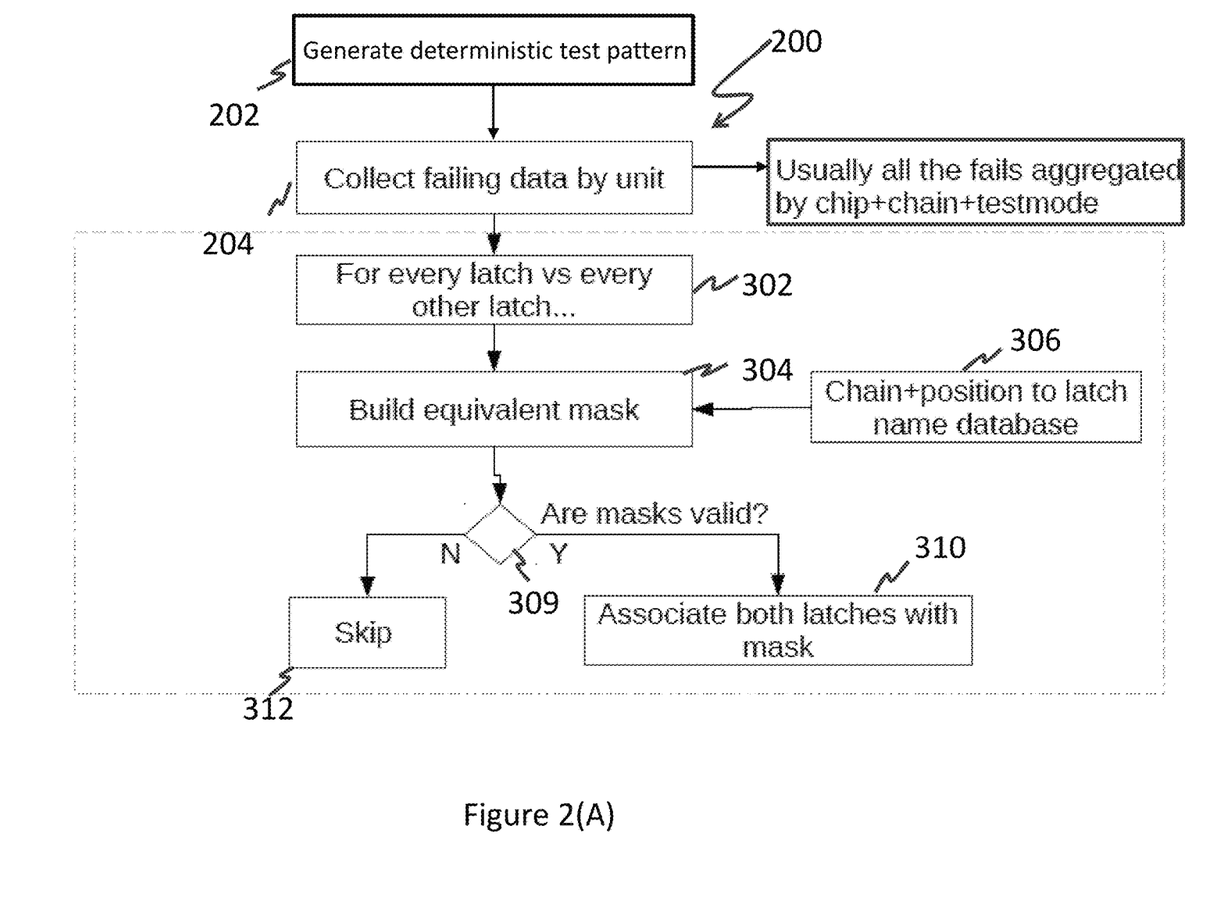
FIG. 2(A) is a depiction of an exemplary method deployed herein for determining defects in integrated circuits.
Figure 2B:
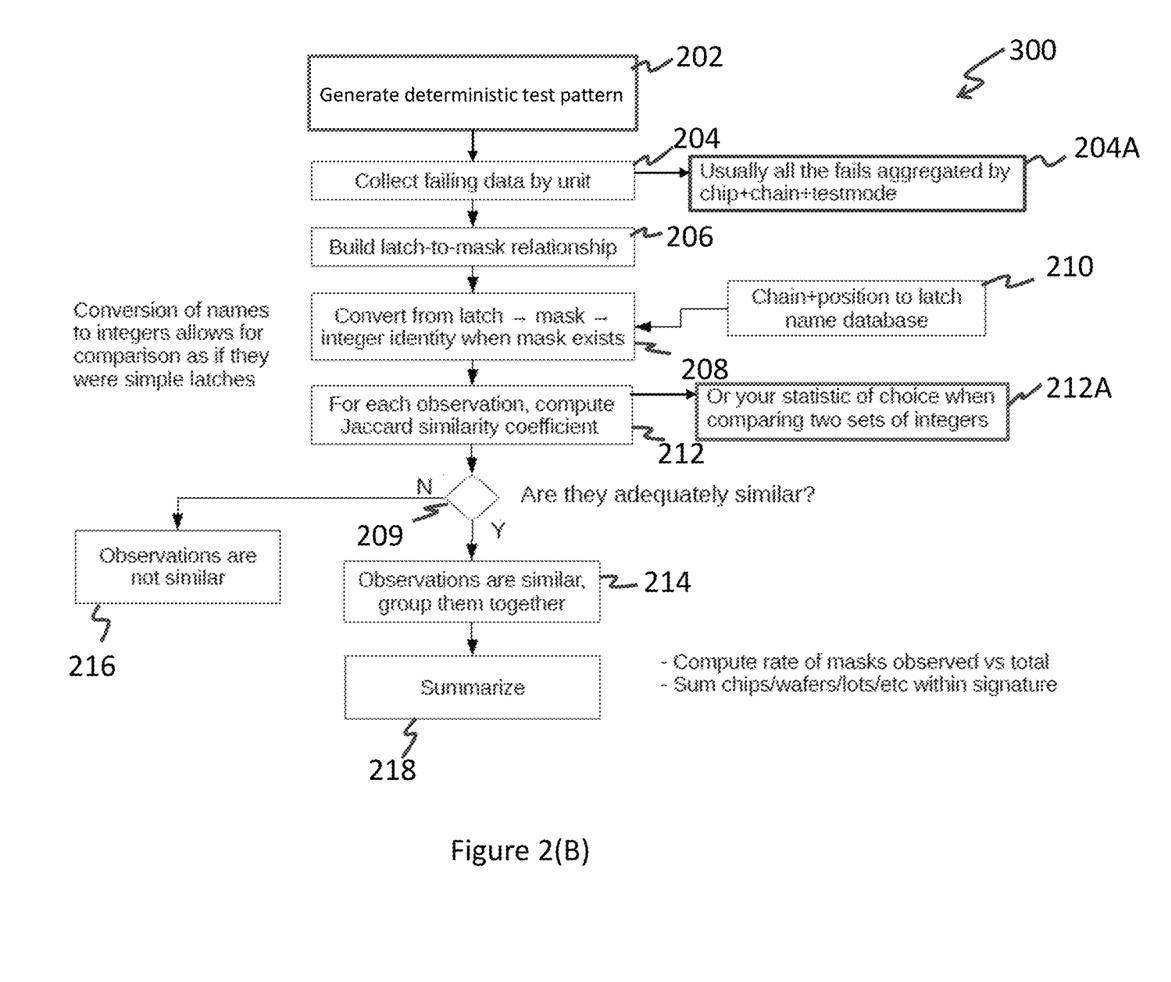
FIG. 2(B) is a depiction of an exemplary method deployed herein for determining defects in integrated circuits.

FIGS. 2(A) and 2(B) include exemplary depictions of the method 200 deployed herein for determining defects in integrated circuits. FIG. 2(A) details the creation of a mask that encompasses all signatures obtained by testing scan chains that comprise latches. The FIG. 2(A) details the creation of a latch-to-mask relationship. The FIG. 2(B) further details using the mask to build commonality between the various defects observed in the latches after the creation of the mask.

The method detailed in the FIGS. 2(A) and 2(B) comprises subjecting the integrated circuit to one of a plurality of testing protocols using one or more base deterministic test pattern (See Step 202 in the FIG. 2(A) and in the FIG. 2(B)) sets that include the following applications: Level Sensitive Scan Design (LSSD), Logic Built In Self Test (LBIST), Array Built In Self Test (ABIST), Design-For-Test (DFT) and Design-For-Diagnostics (DFD). Other test patterns not listed here may also be used. The testing protocol involves the application of one or more of the aforementioned base deterministic test pattern sets generated by an Automatic Test Pattern Generation (ATPG) system to the scan chains. A single application (e.g., one of ABIST, DFT, LSSD, or the like) may be conducted on an integrated circuit one or more times to determine reproducibility.

With reference now to the FIG. 2(A), the signatures obtained from each test for each integrated circuit chip is examined and the data from failing latches is collected (See Step 204). In scan chain design, certain latches couple together into a hardware connection known as a "scan chain". A latch is a circuit that has two stable states and can be used to store state information. The data generated from the testing of the integrated circuits is generally obtained in the form of a scan chain and position. This chain and position within a scan chain configuration (e.g., test mode) represents a unique latch within the design. This latch generally has a fully qualified design name, which describes from the top of the chip level down through the hierarchy to the unique instance of the latch itself. This string description is referred to herein as a "latch name" or simply "name". This name is unique to every other name in the design, such as: "esn.l4q11.l4qabcmp2e4.xcmp_p1_io_enc_nlc_4.I0". This is not necessarily the case, where the representative name could be generated from any set of descriptive details, which describe or imply the circuit content it represents. Knowing or being able to produce names for every latch is not required for this invention and not having this necessity is unique.

From a single test on a single chip, the data in the scan chains are compared to their expected good (e.g., non-failed) state and any mis-compared values are collected and associated to their source chain and position on the tester. A singular defect can produce from one to many fails and these fails may be isolated to a singular scan chain or multiple chains. The fail data collected can be arbitrarily grouped as desired for this invention, though normally fails are grouped by test pass, chip, test type, scan chain configuration (test mode). Grouping further by condition, pattern group, and so on can provide automatic distinction between such things but is not required since this information can be extracted from the observations making up a signature.

In Step 204 of the FIG. 2(A), the name from each latch is compared with that of every other latch across the plurality of tested chips for purposes of creating a mask (See Steps 302 and 304). The names can be compared to a historical database of masks as appropriate to provide consistency of masks across a timeframe (e.g., within a process loop), resulting in signature identifications that are consistent across multiple lots. The mask is a string that represents a collection of latch names that can be broadened or narrowed to convey a desired level of detail (See Step 304). The mask can retain terms that are identical across a plurality of latch names while using wildcards (such as an asterisk (*)) to exemplify differences across the plurality of names. In the generation of a mask for a particular scan chain with failing latches, any type of nomenclature that permits the identification of the chip, the chain, the latch, and/or the test mode may be used.

In short, the mask can be a generated latch name that outputs a definition of the physical implementation of the integrated circuit while at the same time excluding unnecessary details or details that may not lend themselves to a solution of the problem detection with the integrated circuit. The mask signature may comprise substrings. A variety of different design rules may be used to generate the mask. The substrings of the names which lend themselves to compression (wildcarding) are those which describe duplicated or translated copies of a design element such as numbers which represent columns within a macro, core designations, chiplet numbers, bit positions in a bus or I/O, relational, geographical, or ordinal descriptions of the same element, such as top and bottom and so on.

For example, in an embodiment, in a scan chain every latch has a qualified VHDL (or equivalent) name. VHDL (VHSIC Hardware Description Language) is a hardware description language used in electronic design automation to describe digital and mixed-signal systems such as field-programmable gate arrays and integrated circuits. The name can carry hierarchical information, macro-type and implementation details. Other details such as identifying numbers, positional words (e.g., top/bottom, left/right, and the like) may also be used in the mask.

The example below briefly details the creation of a mask. For example, for a particular integrated circuit, a latch name for latches 28804 and 117922 (which are failing latches) may be generated as shown in signature (strings) (1) and (2) as follows:

esn.l4q11.l4qabcmp2e4.xcmp_p1_io_enc_nlc_4.I0
(latch 28804) (1)

esn.l4q11.l4qabcmp0o4.xcmp_p1_io_enc_nlc_1.I0
(latch 117922) (2)

where "e" and "o" represent even and odd positions. "esn" describes the top level nest of the design, "l4" describes that we are in the L4 array within the nest, "q11" means quad 11 within the L4, "l4qab" is the specific macro design within that quad, "cmpXXX" is the comparator used to compare data coming from that array, the next substring describes that we are in the I/O encode of the comparator, and "nlc_#" is which bit position within that encoder. Therefore, depending on which positions are wildcarded and which are not, implies highly useful data. Within a single fail it implies where in the logic is failing and across failures it describes the variation of that defect across the plurality of observations.

A mask is generated between strings (1) and (2) as shown in the string (3). The mask as shown in string (3) represents the minimum edit distance:

esn.l4q11.l4qabcmp*4.xcmp_p1_io_enc_nlc_*.I0 (3)

When producing the masks, the most generic solution (wildcards that represent the most characters) should be used as long as they do not create any confusion with useful design or logical boundaries. In other words, if adding an additional character to a wildcard results in loss of information, which would cloud the interpretation of the resulting signatures then it should not be performed. Likewise, if not adding a character results in multiple signatures being produced which are caused by the same defect mechanism (or test problem) then it should be performed.

As can be seen, the common portions of strings (1) and (2) such as "esn.l4q11.l4qabcmp" and "xcmp_p1_io_enc_nlc" are retained in the mask signature (3) while a wildcard (*) is used in the string (3) to identify the differences. The differences are "2e" in the string (1) and "o4" in the string (2) and "4" and "1" in the strings (1) and (2) respectively. The differences are shown in bolded and underlined type. Two wildcards are therefore used in the string (3).

The resulting mask signature seen in string (3) permits an analyst to determine what is consistent in the signatures (1) and (2) versus factors that are changed in the latch names in a set of scan chains. When latches are the same, latch positions may be used in the mask. The mask can be used to create a database that relates the latch name to a scan chain position (See Step 306).

The masks are then checked for validity (See Step 309). Invalid masks are those which are produced by two incompatible names that do not exhibit adequate similarity, require excessive wildcarding, result in excessive loss of information, or fail any customized test criteria. If the masks are deemed not to be valid (See Step 312), then they can be ignored and new masks created that may be more valid. If the mask is deemed to be valid (See Step 310) then the latches are associated with the mask. If no mask at all is produced by the end of the processing, then either the latch name itself is used or as a shortcut, the original data (chain position) can be used given the next step is to produce integer identities from these names.

FIG. 2(B) details using the mask to build commonality between the various defects observed in the latches after the creation of the mask. Step 202 and 204 of the FIG. 2(B) are identical with those of Steps 202 and 204 of the FIG. 2(A) and will therefore not be repeated in identical detail. However, in the step 204 the data obtained from failing latches may be tabulated as seen in the Table 1 as a preliminary step for identifying commonality.

All of the failures (i.e., the identified defects) may be aggregated by the chip, the chain and the test mode as depicted in the example shown in the Table 1 below (See Steps 204 and 204A). The Table 1 may thus be used to determine and identify failing patterns and failing latch bits.

TABLE 1

| Test | Latch 1 | Latch 2 | ... | Latch n − 1 | Latch n | # latches | Pass/fail |
|---|---|---|---|---|---|---|---|
| Pattern 1 | x | | ... | x | | L1 | 2 |
| Pattern 2 | | | ... | | | L2 | 0 |
| ... | | | ... | | | ... | |
| Pattern m − 1 | | x | ... | x | | Lm − 1 | 2 |
| Pattern m | x | | ... | x | x | Lm | 3 |
| # patterns | P1 | P2 | ... | Pn − 1 | Pn | N | |
| Distinct fail | 2 | 1 | ... | 3 | 1 | | |

The result of the deterministic tests is symbolically shown in the Table 1. The rows in the table correspond to the patterns that were applied during the test and the columns to the latches and primary outputs whose values were inspected as part of the test procedure. The table contains two auxiliary columns and two auxiliary rows. The column labeled "#latches" contains, for each pattern, the number of latches that were found to have incorrect values, with 0 indicating that the pattern did not fail. The column labeled "pass/fail" merely shows whether the value in the previous column is 0 or not. The two auxiliary rows have similar functions. The one labeled "#patterns" contains the number of patterns that caused a particular latch to have an incorrect value, while the row labeled "distinct fail" shows whether the number of failing patterns is 0 or not. The total number of failing values that were observed in any of the failing patterns is N, and is the column sum of the values in the "# latches" column, and is also equal to the row sum of the values in the "# patterns" row. The contents of Table I represent all the available fail data, without omissions, but in a way that is more suitable for determining usable signatures.

Figure 3A:
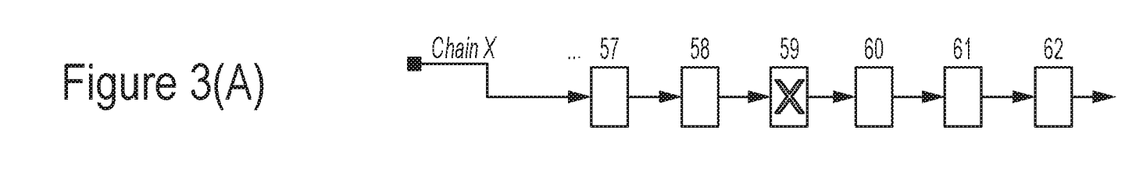
FIG. 3(A) depicts the failure of a single chip on a scan chain.
Figure 3B:
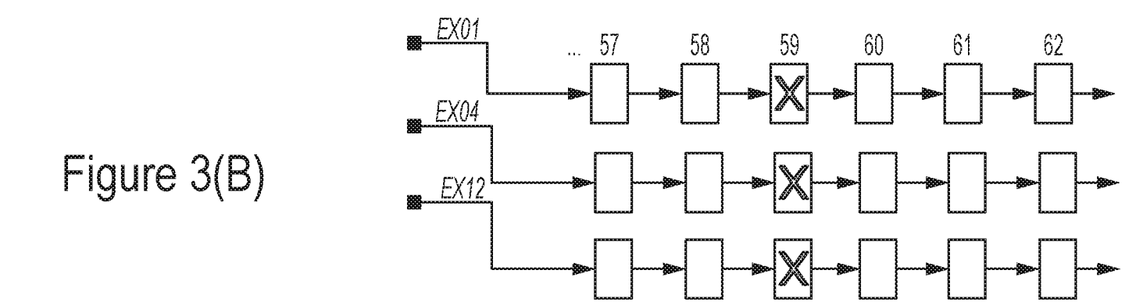
FIG. 3(B) depicts multiple chips failing on the same latch across different scan chains.
Figure 3C:
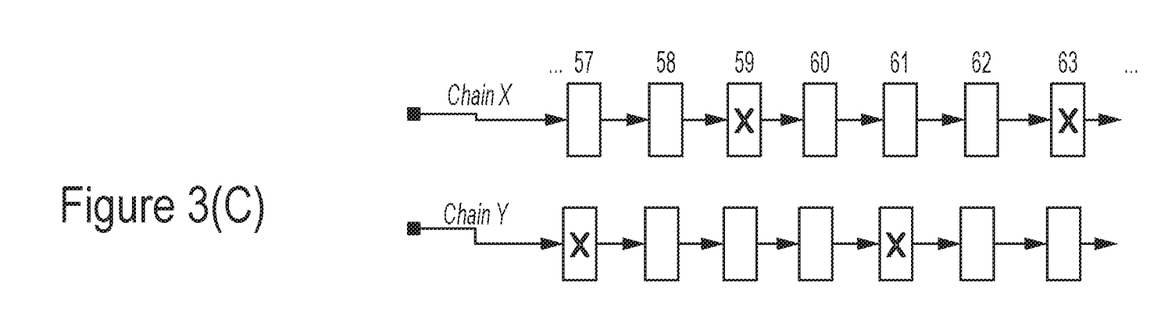
FIG. 3(C) multiple chips failing due to the same defect but across different scan chains.

The results of the deterministic tests may be symbolically represented in the FIGS. 3(A) through 3(C). A scan chain with a latch that, after a given pattern was applied, was found to have an incorrect value is marked by the symbol X in the cell corresponding to that latch. FIG. 3(A) depicts the failure of a single chip on a scan chain, while the FIG. 3(B) depicts multiple chips failing on the same latch across different scan chains. The FIG. 3(C) multiple chips failing due to the same defect but across different scan chains.

With reference now to the FIG. 2(B), the failing data obtained from the scan chains is used to build a latch to mask relationship (See Steps 206). The building of a latch to mask relationship is depicted in steps 302 and 304 of the FIG. 2(A) and will not be repeated here again. The mask is then converted to an integer identity (See Step 208). The mask can be used to create a chain and further to create a position to latch name database (See Step 210).

The mask may then be converted to a numeric identity (See Step 208). This allows the mask to be used as a virtual latch index (a database) that includes chains and the position to the latch name (See Step 210). The conversion of names to integers allows for comparisons between different scan chains as if the masks were simple latches.

In an embodiment, when more detail is available, the attributes of the back cone feeding the latch can be taken into account and used to build commonality in multiple dimensions. Instead of just finding similarity in the latch name, similarity can be determined by commonality in the back cone such as the minimum wire spacing, device voltage, cell types, and the like. Tabulating back cone attributes across failing signatures can provide potential root causes of the problems (when compared to other, passing attributes) without needing to perform full diagnostic deterministic testing routines.

Following the creation of the mask and the conversion of names to integers, steps may be taken to determine similarities (or commonalities) between the masked signatures (See Step 212). A variety of statistical methods may be used to establish the similarity and diversity of different sets from the masked signatures. Examples of such methods include using a simple matching coefficient (SMC), Sørensen similarity index, Mountford's index of similarity, Hamming distance, Dice's coefficient, Tversky index, Jaccard similarity coefficient, or the correlation mutual information which is a variant on the Jaccard similarity coefficient.

An exemplary statistical method for establishing similarities and diversity of different sets from the masked signatures is the Jaccard similarity coefficient. The Jaccard similarity coefficient is a statistic used for comparing the similarity and diversity of sample sets. The Jaccard coefficient measures similarity between finite sample sets, and is defined as the size of the intersection divided by the size of the union of the sample sets as seen in the Equation (4)

$$J(A, B) = \frac{|A \cap B|}{|A \cup B|} \qquad (4)$$

where A and B are the sample sets. The coefficient obtained from (4) can provide information about multiple similarities that are different from each other thus implying a variety of different defects present in the scan chains.

Based on the coefficient obtained from the step 212, a determination is made as to whether the observed similarities (See Step 209). If they are substantially similar, then they are grouped together and summarized (See Steps 214 and 218). If the observations (i.e., a particular coefficient value obtained from the correlations of step 212) are not similar, then they are discarded and another set of similarities may be taken up for observation.

When a correlation is made in step 212, it can be used to compute the observed rate of masks versus the total. It may also be used to provide details of the number of defective chips within a signature, i.e., the different failures may be clustered together to do a root cause analysis.

According to one embodiment, the sets of common failures may be reported to the user computer for use by a user of the user computer. Because various statistical analysis are run on the set of failure data to determine a likely failure mode for a set of common failures, the failures in each set of common failures tend to have a common failure mode and a common root cause. Therefore, reporting the sets of common failures to a designer, a verification engineer, or the like indicates to the designer and verification engineer likely portions of a circuit to analyze to find a root cause of a problem and fix the problem (i.e., debug the problem).

According to another embodiment, a set of common failures (or a failure cluster) is assumed to have a common failure mode and a common root cause failure associated with the failure cluster. Accordingly another set of tests may be planned to "focus" in on the failures that are diagnosed. Simplification tests focus on the suspected failure modes and the suspected common root causes of failures and may include reduced numbers of tests for a test run where the removed tests may not be associated with the suspected failure mode and/or the suspected root causes.

Given each signature can be represented by a signature id and a value (e.g., correlation score) associated to each observation (i.e. the collection of fail data grouped together say by test pass, chip, and so on) generating summaries that extend beyond the original source data is possible. For example, if a chip has a three fails on chain X, at positions [1,2,3], after mask generation the array becomes [−55, 2, −66] where the negative values represent the unique identity of the mask (those masks may relate to failing latch values not on chain X). The value "2" in the array does not relate to any other known failing latch and is unique. It is allowed to also use the latch name identity as well it is left as an implementation detail. When compared to the rest of the observations it is found that other observations adequately relate to this and a signature id #1 is assigned to this data. Where other observations which have a 100 score have an identical array ([−55, 2, −66]), while other correlating observations only share two values (e.g., [−7, −55, −66], or [−55, −66], and the like). Reports are then easily computed to tally the number of chips that are perfectly matching, those that match within a prescribed limit, and so on. Given the signature id is assigned to the source data (or an id is linked in software to it contributing data), no data is lost and additional summaries are possible such as reporting the exact latch names used within each mask and how they relate across the set of observations within this signature. This signature id is consistent across runs and can be used to compare across multiple points in time for trends to see how a specific signature changes through process history as well as across multiple chip designs with share design elements.

Using the same example above, the mask that is represented by "−55" may consist of a single latch name or many latch names. An additional "mask score" can be reported that describes how similar the latches are within a signature's masks. This entails computing the average number of observations for each latch name over the total number of observations in the signature. For example, say "−55" represents a register file where the column index has the wildcard. If every fail observation failed single but different column the mask score would be low (no overlap in actual latch names between observations). As latch names across observations overlap with other observations the score will raise, thus providing additional insight into similarity within a signature.

The simplification of tests may be iteratively performed by iteratively removing test instructions from a test run. That is, a first set of test instructions may be removed from a test, and the simplified tests may be run and analyzed as described above by generating sets of failure data, clustering the failures, and thereafter, removing additional test instructions from a test. This step may be repeated to focus on a failure, for example, of a suspected failure mode and a suspected root cause of a failure.

In summary, the method comprises generating a mask based upon a population of representative latch names; generating a latch to mask relationship for the failing latches; generating data that is most easily compared to observations across a plurality of integrated circuit chips; producing defect signatures from the data; grouping observations into those signatures to determine commonality; and enabling a connection between the signature and the originating source data it represents.

Put another way, the method comprises generating defect signatures for failing latches from a plurality of integrated circuit chips; generating a latch to mask relationship for the failing latches; generating maximally descriptive masks into identities; generating a list of identities for comparison; determining commonalities between the lists of identities; and generating details about differences and commonalities within the defect signatures.

Disclosed herein too is a computer program product comprising a non-transitory storage medium readable by a processing circuit and storing instructions for execution by the processing circuit for performing a method comprising generating a mask based upon a population of representative latch names; generating a latch to mask relationship for the failing latches; generating data that is most easily compared to observations across a plurality of integrated circuit chips; producing defect signatures from the data; grouping observations into those signatures to determine commonality; and enabling a connection between the signature and the originating source data it represents.

Disclosed herein too is a computer program product comprising a non-transitory storage medium readable by a processing circuit and storing instructions for execution by the processing circuit for performing a method comprising generating defect signatures for failing latches from a plurality of integrated circuit chips; generating a latch to mask relationship for the failing latches; generating maximally descriptive masks into identities; generating a list of identities for comparison; determining commonalities between the lists of identities; and generating details about differences and commonalities within the defect signatures.

This method is advantageous in that it allows for broad classification of repeating signatures in multiple data types while providing data to make further judgments. It can be used in logic and scan-chain diagnostic data. It is inexpensive in that it does not use a huge computing environment. It does not require sharing physical design data. It only requires a design owner to provide chain position to name cross reference and valid replacement rules and test modes. It can provide implied details of a failing back cone (that feeds the latch) without the need to spend time processing the back cone.

The method and the system detailed herein can be exemplified by the following non-limiting example.

EXAMPLE

Example 1

This example is conducted to demonstrate how using a mask on signatures generated from a testing protocol may be used to determine commonalities in failing latches. The testing protocol most easily described using ATPG data but can be used anywhere that the fail data implies details about the logic under test.

Figure 4:
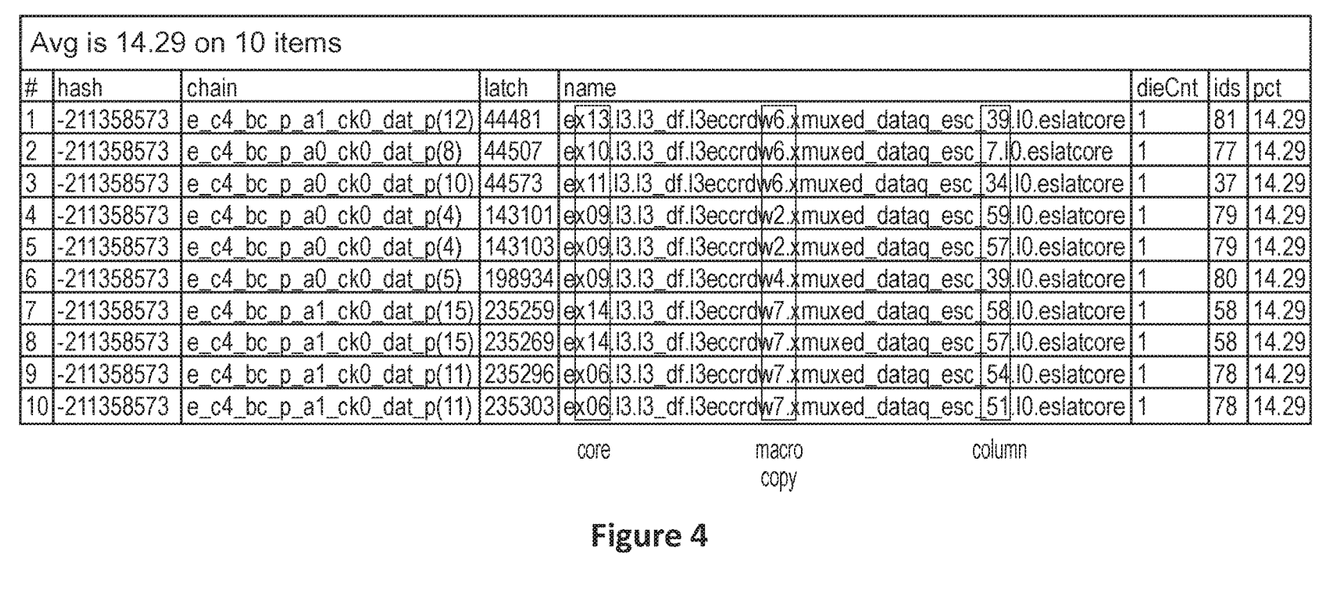
FIG. 4 is a table that shows the mask generated for a series of signatures obtained by testing a number of chips.

The test was conducted on hundreds of chips though 8 chips showed commonality in their failures. The signatures obtained from the test data are shown in the Table shown in the FIG. 4. From the Table in the FIG. 4 it may be seen that there are 7 chips each with 1 failing latch and a single chip with 4 failing latches. All failing latches share the same mask (their equivalent latch (hash) is identical). As can be seen in the Table, the mask (in column 2 labelled "hash") in its integer identity form is identical for all 8 chips. Thus by using a mask on the generated signatures and by converting the mask to an integer identity, 8 chips having a common defect can be identified.

In summary, generating a signature from a test, masking the signature and identifying commonalities from the mask is an easy way to generate a list of defects that may be used to fix manufacturing and materials procurement processes to facilitate inexpensive and error free manufacturing.

A number of implementations have been described. Nevertheless, it will be understood that various modifications may be made without departing from the spirit and scope of the disclosure. For example, various forms of the flows shown above may be used, with steps re-ordered, added, or removed. Accordingly, other implementations are within the scope of the following claims.

Embodiments and all of the functional operations described in this specification may be implemented in digital electronic circuitry, or in computer software, firmware, or hardware, including the structures disclosed in this specification and their structural equivalents, or in combinations of one or more of them. Embodiments may be implemented as one or more computer program products, i.e., one or more modules of computer program instructions encoded on a computer readable medium for execution by, or to control the operation of, data processing apparatus. The computer readable medium may be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus may include, in addition to hardware, code that creates an execution environment for the computer program in question, e.g., code that constitutes processor firmware, a protocol stack, a database management system, an operating system, or a combination of one or more of them. A propagated signal is an artificially generated signal, e.g., a machine-generated electrical, optical, or electromagnetic signal that is generated to encode information for transmission to suitable receiver apparatus.

A computer program (also known as a program, software, software application, script, or code) may be written in any form of programming language, including compiled or interpreted languages, and it may be deployed in any form, including as a stand alone program or as a module, component, subroutine, or other unit suitable for use in a computing environment. A computer program does not necessarily correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

The processes and logic flows described in this specification may be performed by one or more programmable processors executing one or more computer programs to perform functions by operating on input data and generating output. The processes and logic flows may also be performed by, and apparatus may also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both.

The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks.

However, a computer need not have such devices. Moreover, a computer may be embedded in another device, e.g., a tablet computer, a mobile telephone, a personal digital assistant (PDA), a mobile audio player, a Global Positioning System (GPS) receiver, to name just a few. Computer readable media suitable for storing computer program instructions and data include all forms of nonvolatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory may be supplemented by, or incorporated in, special purpose logic circuitry.

To provide for interaction with a user, embodiments may be implemented on a computer having a display device, e.g., a CRT (cathode ray tube) or LCD (liquid crystal display) monitor, for displaying information to the user and a keyboard and a pointing device, e.g., a mouse or a trackball, by which the user may provide input to the computer. Other kinds of devices may be used to provide for interaction with a user as well; for example, feedback provided to the user may be any form of sensory feedback, e.g., visual feedback, auditory feedback, or tactile feedback; and input from the user may be received in any form, including acoustic, speech, or tactile input.

Embodiments may be implemented in a computing system that includes a back end component, e.g., as a data server, or that includes a middleware component, e.g., an application server, or that includes a front end component, e.g., a client computer having a graphical user interface or a Web browser through which a user may interact with an implementation, or any combination of one or more such back end, middleware, or front end components. The components of the system may be interconnected by any form or medium of digital data communication, e.g., a communication network. Examples of communication networks include a local area network ("LAN") and a wide area network ("WAN"), e.g., the Internet.

The computing system may include clients and servers. A client and server are generally remote from each other and typically interact through a communication network. The relationship of client and server arises by virtue of computer programs running on the respective computers and having a client-server relationship to each other.

While this specification contains many specifics, these should not be construed as limitations on the scope of the disclosure or of what may be claimed, but rather as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems may generally be integrated together in a single software product or packaged into multiple software products.

In each instance where an HTML file is mentioned, other file types or formats may be substituted. For instance, an HTML file may be replaced by an XML, JSON, plain text, or other types of files. Moreover, where a table or hash table is mentioned, other data structures (such as spreadsheets, relational databases, or structured files) may be used.

While the invention has been described with reference to some embodiments, it will be understood by those skilled in the art that various changes may be made and equivalents may be substituted for elements thereof without departing from the scope of the invention. In addition, many modifications may be made to adapt a particular situation or material to the teachings of the invention without departing from essential scope thereof. Therefore, it is intended that the invention not be limited to the particular embodiments disclosed as the best mode contemplated for carrying out this invention, but that the invention will include all embodiments falling within the scope of the appended claims.

What is claimed is:

1. A method for failure signature detection in a semiconductor using a test system comprising:
   using the test system, comprising a processing unit and a memory, to perform deterministic tests on a plurality of integrated circuit chips to generate defect signatures for failing latches from the plurality of integrated circuit chips, the deterministic test comprising:
   subjecting, by the test system, a plurality of latches to one of a plurality of testing protocols using one or more base deterministic test patterns;
   generating, by the test system, defect signatures for failing latches from a plurality of integrated circuit chips in response to the test pattern;
   comparing each of the plurality of latches with each other to create a mask;
   generating, by the test system, a latch to mask relationship for the failing latches;
   generating, by the test system, maximally descriptive masks into identities;
   generating, by the test system, a list of identities for comparison;
   determining, by the test system, commonalities between the lists of identities;
   generating, by the test system, details about differences and commonalities within the defect signatures;
   fixing, by the test system, manufacturing and materials procurement processes associated with the plurality of integrated circuit chips based on the defect signatures; and
   facilitating manufacturing of at least one integrated circuit using the fixed manufacturing and materials procurement processes.

2. The method of claim 1, where the generating the mask comprises retaining common portions of a plurality of defect signatures while replacing differences in the plurality of defect signatures with a wildcard.

3. The method of claim 1, where the generating the latch to mask relationship for failing latches comprises using nomenclature that permits the identification of the integrated circuit chip, a chain, the latch, and/or a test mode used.

4. The method of claim 3, where the generating the latch to mask relationship further comprises building an equivalent mask that encompasses all data obtained in the defect signatures for a plurality of failing latches.

5. The method of claim 1, further comprising converting the mask into a numeric identity.

6. The method of claim 5, further comprising using the numeric identity as a pseudo-latch index.

7. The method of claim 1, further comprising aggregating defect signatures for failing latches by the integrated circuit chip, a scan chain along which the latch is located and the test mode that produces the latch defect.

8. The method of claim 1, where the commonalities indicate the existence of a particular type of defect in the integrated circuit.

9. The method of claim 1, where the commonalities indicate groups of latch identities that have similar characteristics.

10. The method of claim 1, where the commonalities are determined by performing similarity tests on numeric identities of the mask.

11. A computer program product comprising:
    a non-transitory storage medium readable by a processing circuit and storing instructions for execution by the processing circuit for performing a method of performing deterministic tests on a plurality of integrated circuit chips to generate defect signatures for failing latches from the plurality of integrated circuit chips, the method comprising:
    generating defect signatures for failing latches from a plurality of integrated circuit chips;
    generating a latch to mask relationship for the failing latches;
    generating maximally descriptive masks into identities;
    generating a list of identities for comparison;
    determining commonalities between lists of identities;
    generating details about differences and commonalities within a signature;
    fixing manufacturing and materials procurement processes associated with the plurality of integrated circuit chips based on the defect signatures; and
    facilitating manufacturing of at least one integrated circuit using the fixed manufacturing and materials procurement processes.

12. A test system for failure signature detection in a semiconductor comprising:
    a processing unit; where the processing unit is operative to perform deterministic tests on integrated circuit chips to generate defect signatures for failing latches from a plurality of integrated circuit chips;
    a memory that is communication with the processing unit; where the memory comprises:
    an analyzing system that is operative to analyze a plurality of defect signatures derived from the failing latches;
    a modifying system that is operative to:
    generate defect signatures for failing latches from a plurality of integrated circuit chips;

generate a latch to mask relationship for the failing latches;
generate maximally descriptive masks into identities;
generate a list of identities for comparison;
determine commonalities between lists of identities;
generate details about differences and commonalities within a signature;
fix manufacturing and materials procurement processes associated with the plurality of integrated circuit chips based on the defect signatures; and
facilitate manufacturing of at least one integrated circuit using the fixed manufacturing and materials procurement processes.

13. The test system of claim 12, where the generating defect signatures is accomplished by testing the integrated circuit chips using deterministic test pattern sets generated by an Automatic Test Pattern Generation system or diagnostic chain patterns.

14. The test system of claim 12, where the generating the mask comprises retaining common portions of a plurality of defect signatures while replacing differences in the plurality of defect signatures with a wildcard.

15. The test system of claim 12, where the generating the latch to mask relationship for failing latches comprises using nomenclature that permits the identification of the integrated circuit chip, a chain, the latch, and/or a test mode used.

16. The test system of claim 15, where the generating the latch to mask relationship further comprises building an equivalent mask that encompasses all data obtained in the defect signatures for a plurality of failing latches.

17. The method of claim 1, further comprising performing a simplification test on the plurality of latches based on the defect signatures, wherein the simplification test is based on suspected failure modes or suspected common root causes of failures associated with the plurality of latches.

18. The method of claim 17, wherein the simplification test is an iterative test that removes one or more test instructions from a test run to determine a suspected failure mode or a suspected root cause of a failure.

19. The test system of claim 12, further comprising performing a simplification test on the plurality of latches based on the defect signatures, wherein the simplification test is based on suspected failure modes or suspected common root causes of failures associated with the plurality of latches.

* * * * *